United States Patent
Sherry et al.

[11] Patent Number: 5,805,091
[45] Date of Patent: Sep. 8, 1998

[54] REFERENCE VOLTAGE CIRCUIT

[75] Inventors: Adrian Sherry, Dublin; Damien McCartney, Limerick, both of Ireland

[73] Assignee: Analog Devices, Inc., Norwood, Mass.

[21] Appl. No.: 600,314

[22] Filed: Feb. 12, 1996

[51] Int. Cl.[6] .................................................. H03M 1/10
[52] U.S. Cl. ........................................ 341/120; 340/662
[58] Field of Search .................................. 341/120, 118, 341/155; 340/650, 662, 663; 361/86, 87

[56] References Cited

U.S. PATENT DOCUMENTS

| | | | |
|---|---|---|---|
| 3,931,547 | 1/1976 | Glogolja .................................... | 361/87 |
| 4,510,549 | 4/1985 | Tedesco .................................... | 361/86 |
| 4,827,149 | 5/1989 | Yabe ......................................... | 307/64 |
| 4,829,290 | 5/1989 | Ford ......................................... | 340/663 |
| 4,980,791 | 12/1990 | Alberkrack et al. ...................... | 361/90 |
| 5,294,890 | 3/1994 | Hemminger et al. .................... | 324/549 |

OTHER PUBLICATIONS

Analog Devices 3V/5 V, CMOS, 500 $\mu$A, Signal Conditioning ADC, AD7714, Oct. 1994.

Primary Examiner—Marc S. Hoff
Attorney, Agent, or Firm—Fish & Richardson P.C.

[57] ABSTRACT

An invalid reference detection circuit formed on a semiconductor chip having: reference input terminals adapted for coupling to a reference source external to the chip; a local reference source; and comparison circuit. The comparison circuit is responsive to the local reference source and a condition at the reference input terminals to detect an invalid condition at the reference input terminals and to produce an output signal indicative of the detected invalid condition. The invalid condition at the reference input terminals may be an open circuit condition at at least one of the reference input terminals, a condition when the voltage across the reference input terminals is below a predetermined minimum voltage level, a condition when the voltage across the reference input terminals is above a predetermined maximum voltage level, and/or a short circuit condition. An analog/digital conversion system is formed on a semiconductor chip together with the invalid reference detection circuit. The reference input terminals are adapted for coupling to the reference source external to the chip to the conversion circuitry to provide a reference for such conversion circuitry.

12 Claims, 6 Drawing Sheets

REFERENCE VOLTAGE CIRCUIT

BACKGROUND OF THE INVENTION

This invention relates generally to reference voltage circuits and more particularly to circuits adapted to detect an invalid reference voltage.

As is known in the art, a variety of circuits require a voltage source adapted to provide a predetermined, substantially invariant (i.e., stable) voltage level. Such circuits include, for example, analog/digital conversion systems (i.e., analog to digital converters or digital to analog converters). Such voltage supply is generally referred to as a reference voltage supply. With analog to digital converters (ADCs), a digital word is produced as a result of comparing the level of an input analog signal with the level of at least one reference voltage. The reference voltage, in such case, may be generated by a supply external to the ADC chip or it may be generated by a source internal to the ADC chip itself. In the former case, the external reference voltage supply has the + and − terminals connected to the REFIN(+) and REFIN(−) terminals, respectively, of the ADC. Because the digital conversion of the analog input signal is always performed by a comparison of the level of the input signal to the level of the reference voltage it is important that the level of the reference voltage remain valid during the conversion process. Thus, a reference voltage level will become invalid when there is an open circuit at the output of the external reference voltage supply or where the voltage produced by the external reference voltage supply is below a predetermined minimum voltage level, as for example, when a short circuit develops across the external reference voltage supply. An analogous situation arises in a digital to analog converter (DAC).

More particularly, one application where an ADC is used is in converting a voltage produced by a measuring circuit, such as a resistor bridge circuit. In such application, a reference voltage to the bridge may also provide the external reference voltage for the ADC. In such case, the external voltage reference supply is connected to the REFIN(+) and REFIN(−) terminals of the ADC. The bridge output signal is coupled to the ADC for conversion. Again, as discussed above, the conversion requires a comparison between the level of the analog signal and the level of the reference voltage. In many instances the sensor bridge circuit is located remotely from the ADC, and consequently long cables are required to carry the external reference voltage level and the analog signal input level (i.e., the bridge circuit output) from the bridge to the ADC. Should this cable break, or a short circuit develop within the cable, at some point between the bridge circuit and the ADC, a valid reference voltage from the external supply will not reach the REFIN (+) and REFIN(−) terminals of the ADC. In the case of an open circuit, the converter result may appear close to being correct. For example, if the voltage on the REFIN(+) terminal remains charged close to the reference voltage supply, or drifts towards the reference voltage supply, the fault in the reference voltage may not be readily detected. In the case of the short circuit, or where the bridge supply voltage fails below a predetermined minimum voltage level, as for example, when a short circuit develops across the external reference voltage supply, while the ADC may continue to produce output data, it may not be readily apparent that the external reference voltage supply has failed to provide the proper level to the REFIN(+) and REFIN(−) terminals of the ADC.

SUMMARY OF THE INVENTION

In accordance with the present invention, an invalid reference detection circuit is provided. The circuit includes reference input terminals formed on a semiconductor chip. The reference input terminals are adapted for coupling to a reference source external to the chip. A local reference source and comparison circuit are formed on the chip. The comparison circuit is responsive to the local reference source and a condition at the reference input terminals to detect a valid/invalid condition at the reference input terminals and to produce an output signal indicative of the detected valid/invalid condition. The invalid condition at the reference input terminals may be an open circuit condition at at least one of the reference input terminals, a condition wherein the voltage across the reference input terminals is below a predetermined minimum voltage level, a condition wherein the voltage across the reference input terminals is above a predetermined maximum voltage level, and/or a short circuit condition.

In accordance with another feature of the invention, a method for detecting an open circuit condition on at least one of a pair of reference input terminals is provided. With such method, charge is periodically transferred between the pair of reference input terminals by a switched capacitor so that the voltage difference between the terminals decreases below a predetermined level in the presence of the open circuit condition. Detection is made as to whether the voltage difference between the terminals is below the predetermined level. An output signal is produced indicative of such detection.

In accordance with another feature of the invention, an analog/digital conversion system is formed on a semiconductor chip. An invalid reference detection circuit is provided. The invalid reference circuit includes reference input terminals formed on the chip. The reference input terminals are adapted for coupling to a reference source external to the chip and to the conversion circuitry to provide a reference for such conversion circuitry. A local reference source is also formed on the chip. A comparison circuit, formed on the chip, is responsive to the local reference source and a condition at the reference input terminals, to detect a valid/invalid condition at the reference input terminals and to produce an output signal indicative of the detected valid/invalid condition.

In a preferred embodiment, the conversion circuitry includes circuitry for causing the conversion circuitry to produce a predetermined output signal when the comparison circuit output signal indicates detection of an invalid condition at the reference input terminals.

In accordance with another feature of the invention, a circuit is provided having formed on a semiconductor chip: a local reference voltage source; an external reference voltage switch section; a local reference voltage switch section; and a comparator. The external reference voltage switch section includes: input terminals adapted for coupling to an reference voltage source disposed external to the chip; and a first capacitor. The local reference voltage switching section is coupled to the local reference voltage source and includes a second capacitor. The first capacitor has a first plate connected to the external reference voltage switching section and a second plate connected to an input terminal of the comparator. The second capacitor has a first plate connected to the local reference voltage switching circuit and a second plate connected to the input terminal of the comparator.

In one embodiment, the switching sections include a plurality of switches. A controller is provided for producing control signals for the plurality of switches to operate the circuit in sequential phases. During one phase, one of the pair of external reference voltage input terminals and a first polarity of a local reference voltage source are coupled to the input of the comparator through the first and second capacitors, respectively, and a fixed reference potential is established at the second plates of the capacitors. During a succeeding phase, the second one of the pair of external reference voltage input terminals and a second polarity of the local reference voltage source are coupled through the first and second capacitors, respectively, to the input of the comparator and the fixed reference potential is removed from the second plates of the capacitors. The comparator produces at the termination of the second phase an output indicative of whether the reference voltage is valid or invalid in response to the voltage produced at the input to the comparator.

BRIEF DESCRIPTION OF THE DRAWING

Other features of the invention, as well as the invention itself, will be more readily apparent with reference to the description taken together with the following drawings, in which.

DESCRIPTION OF THE PREFERRED EMBODIMENTS

Figure 1:
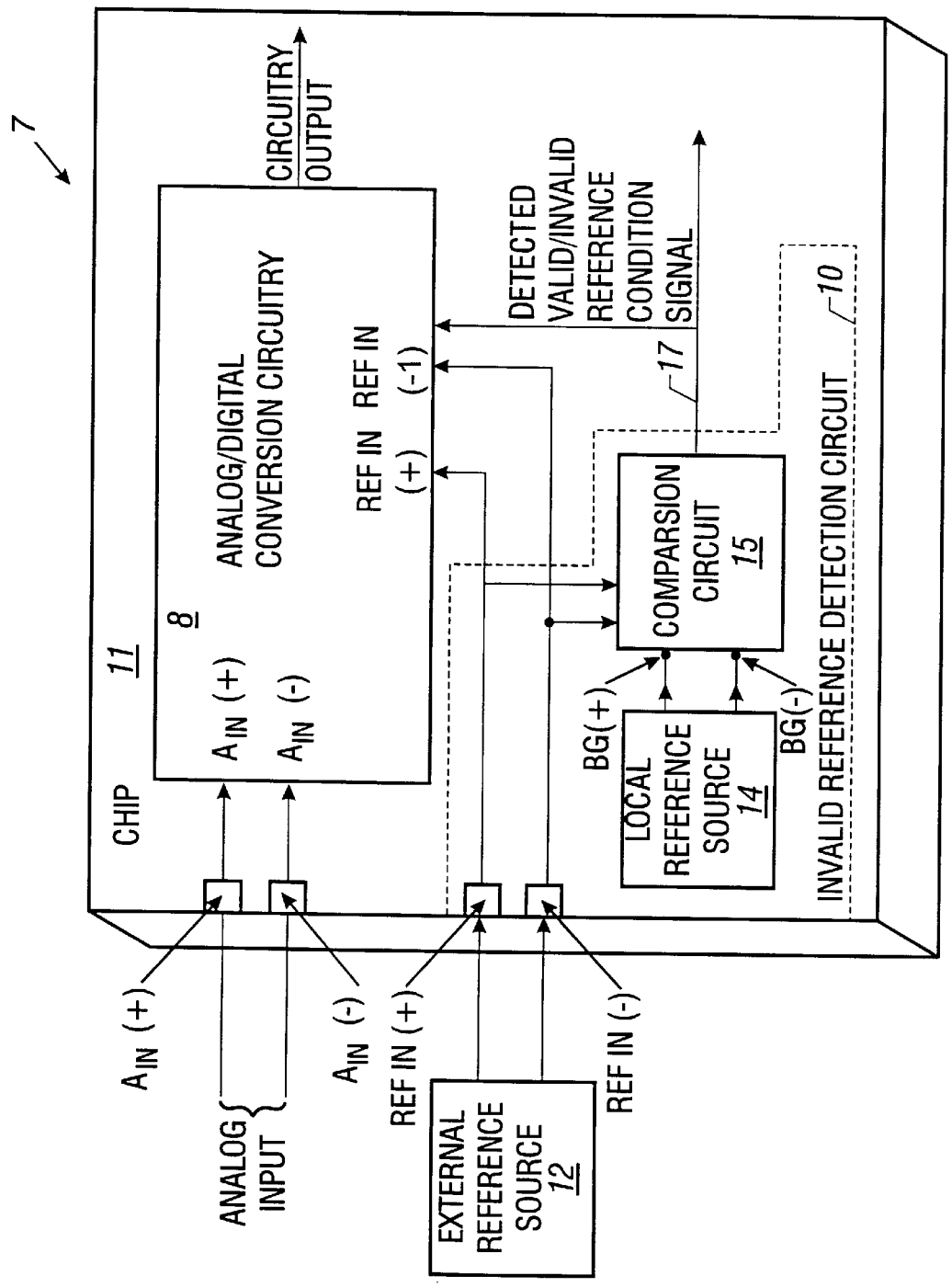
FIG. 1 is a schematic diagram of an analog/digital conversion system according to the invention.

Referring now to FIG. 1, an analog/digital conversion system 7 is shown to include analog/digital conversion circuitry 8 and an invalid reference detection circuit 10 formed on a semiconductor chip 11. The analog/digital conversion circuitry 8 may be an analog to digital converter (ADC) or digital to analog converter (DAC). The invalid reference circuit 10 includes reference input terminals REFIN(+), REFIN(−) formed on the chip 11. (It is understood that the REFIN(−) terminal may be the ground terminal for the chip 11). The reference input terminals REFIN (+), REFIN(−) are adapted for coupling to a reference source 12 external to the chip 11 and to the conversion circuitry 8 to provide a reference for such conversion circuitry 8. A local reference source 14 is also formed on the chip. A comparison circuit 15, formed on the chip 11, is responsive to the local reference source 14 and a condition at the reference input terminals REFIN(+), REFIN(−), to detect a valid/invalid condition at the reference input terminals REFIN(+), REFIN(−) and to produce an output signal on line 17 indicative of the detected valid/invalid condition.

Figure 2:
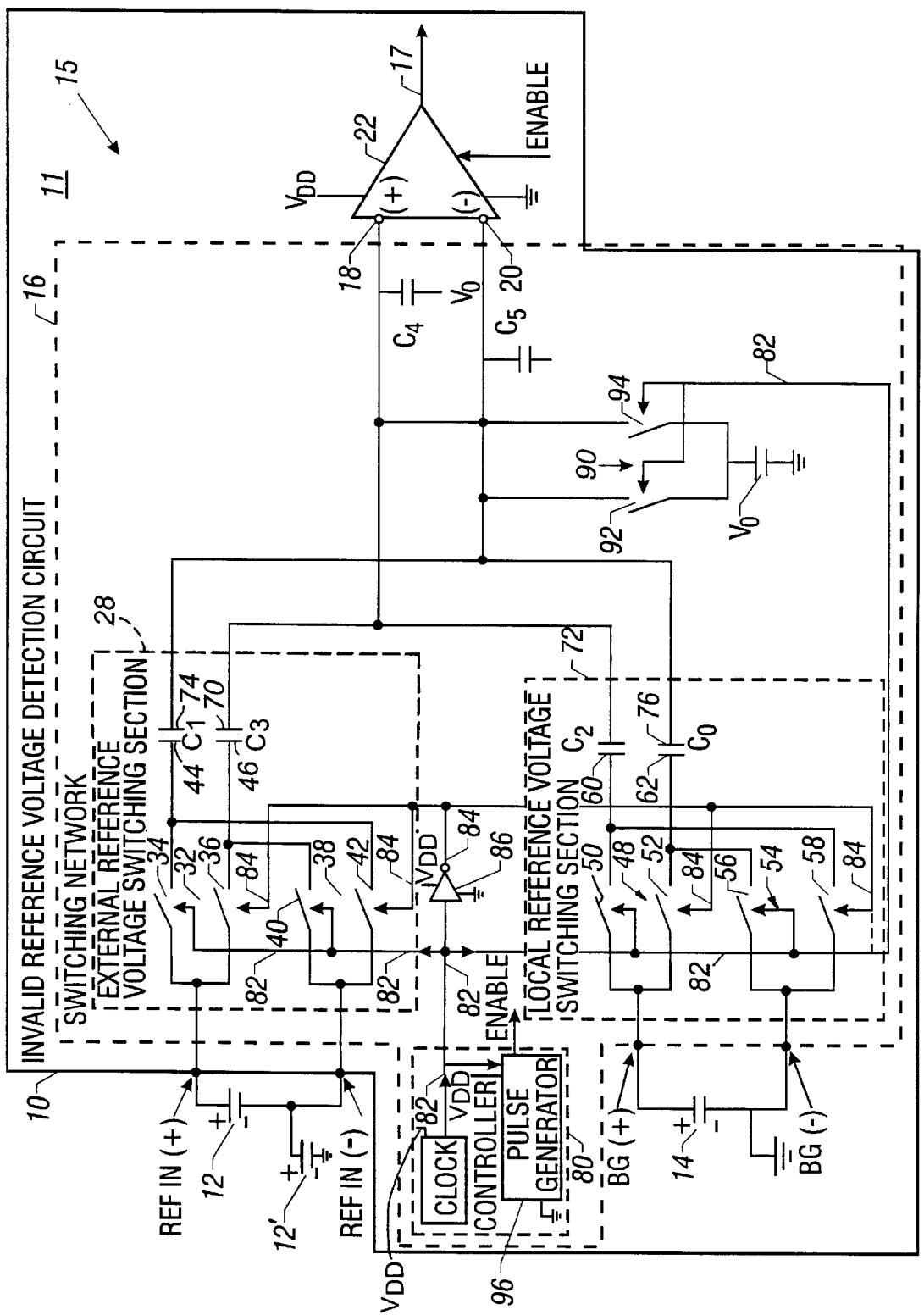
FIG. 2 is a schematic diagram of an invalid reference voltage detection circuit, such circuit being adapted for use in the analog/digital conversion system of FIG. 1.

More particularly, and referring also to FIG. 2, the circuit 10 as noted above, is formed on an integrated circuit chip 11 and includes reference voltage input terminals REFIN(+), REFIN(−) adapted for coupling to the (+), (−) potentials, respectively, of an external reference voltage supply 12, as shown. The supply 12 is coupled to ground through a common mode reference voltage, 12'. (It should be noted that the common mode reference voltage, 12' may be zero).

The external voltage supply 12 is here external to chip 11. The circuit 10 also includes a local reference voltage source 14, formed on chip 11, having the (+), (−) potentials (i.e., the voltages $V_{BG(+)}$, $V_{BG(-)}$, respectively) connected to terminals BG(+), BG(−), respectively, as shown. Here, the local reference voltage source 14 is a bandgap voltage of 1.25 volts produced on the integrated circuit chip 11, where terminal BG(+) is at +1.25 volts and BG(−) is at 0 or ground potential.

Figure 3A:
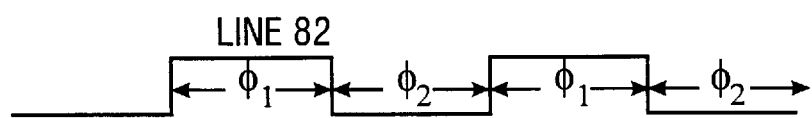
FIGS. 3A, 3B and 3C are timing diagrams useful in understanding the operation of the invalid reference voltage detection circuit of FIG. 2.
Figure 3B:

The circuit 10 operates in sequential phases, $\phi_1$, $\phi_2$, as shown in FIGS. 3A and 3B. During a first phase, $\phi_1$, a switching network 16, formed on chip 11, couples the external reference voltage input terminals REFIN (+), REFIN (−) and the terminals BG(−), BG(+) to the (−), (+) input terminals 20, 18, respectively, of a comparator 22 formed on chip 11, as shown, and also establishes at the (+), (−) input terminals 18, 20 to the comparator 22 a fixed reference potential, $V_0$. The fixed reference potential, $V_0$, is a potential intermediate the chip supply voltage $V_{DD}$, here 5 volts, and ground, fed to inter alia, the comparator 22. Here, a valid external reference voltage supply 12 of 5 volts is expected; i.e., a voltage significantly greater than the 1.25 volts produced by the band gap, local reference voltage source 14.

Figure 3C:

During a succeeding phase, $\phi_2$, the switching network 16 couples the external reference voltage input terminals REFIN(+), REFIN(−) and the local reference voltage terminals BG(−), BG(+) to the (+), (−) input terminals 18, 20, respectively, as shown, of the comparator 22. If a valid external reference voltage supply 12 is connected to the pair of reference voltage input terminals, REFIN(+), REFIN (−), the voltage at the (+) input terminal 18 to the comparator 22 will be become more positive than the voltage at the (−) input terminal 20 to the comparator 22. On the other hand, if an invalid external reference voltage supply 12 is connected to the pair of reference voltage input terminals REFIN(+), REFIN (−), the voltage at the (−) input terminal 20 to the comparator 22 will become more positive than the voltage at the (+) input terminal 18 to the comparator 22. The comparator 22 produces, in response to an enable signal produced on line ENABLE (FIG. 3C) by pulse generator 96 at the termination of the second phase, $\phi_2$, an indication on output line 17 of whether the reference voltage supply 12 connected to terminals REFIN(+) and REFIN(−) is valid or invalid. Such indication is made in accordance with the voltage produced on input terminals 18, 20 during the second phase, $\phi_2$. Thus, the comparison circuit 15 in FIG. 1 includes the switching network 16 and the comparator 22.

The switching network 16 includes a first switching section, here external reference voltage switching section 28 and a second switching section, here a local reference voltage switching section 30. Switching section 28 includes a first pair 32 of switches 34, 36 having inputs connected to the reference input terminal REFIN(+), and second pair 38 of switches 40, 42 having inputs connected to the reference input terminal REFIN(−), as shown. A pair of capacitors $C_1$, $C_3$ is also included in the switching section 28. Capacitor $C_1$ has a capacitance $C_1$ and capacitor $C_3$ has a capacitance $C_3$. Capacitor $C_1$ has a first plate, or electrode 44 coupled to an output of switch 34 and to an output of switch 42. Capacitor $C_3$ has a first plate, or electrode 46 coupled to an output of switch 36 and to an output of switch 40, as shown.

The switching section 30 includes a first pair 48 of switches 50, 52 having inputs connected to the local reference voltage source 14 terminal BG(+) and a second pair 54 of switches 56, 58 having inputs connected to the local reference voltage source 14 terminal BG(−), as shown. The switching section 30 includes a pair of capacitors $C_2$, $C_o$. Capacitor $C_2$ has a capacitance $C_2$ and capacitor $C_0$ has a capacitance $C_o$. Capacitor $C_2$ has a first plate or electrode 60 coupled to an output of switch 50 and to an output of switch 58. Capacitor $C_0$ has a first plate, or electrode 62 coupled to an output of switch 52 and to an output of switch 56.

The comparator 22 has the (+) input terminal 18 connected to a second plate, or electrode 70 of capacitor $C_3$ and to a second plate, or electrode 72 of capacitor $C_2$. The (−) input terminal 20 is coupled to the second plate or electrode 74 of capacitor $C_1$ and to the second plate or electrode 76 of capacitor $C_0$, as shown.

A controller 80 either formed on, or external to, chip 11, is provided for producing a train of binary clock signals on line 82 for controlling the switches 34, 36, 40, 42, 50, 52, 56, and 58. While line 82 is connected directly to switches 34, 40, 50 and 56, line 82 is coupled to switches 36, 42, 52, and 58 through an output 84 of inverter 86, as shown. Thus, the switches in each pair: 34, 36; 40, 42; 50, 52; and 56, 58 are placed in complementary logic states (e.g., when switch 34 is open, switch 36 is closed and vis versa) by the complementary binary control signals on lines 82, 84. The control signals on lines 82, 84 are shown in FIGS. 3A and 3B, respectively. Thus, the train of binary signals on line 82 is shown in FIG. 3A and the complementary train of pulses produced by inverter 86 on line 84 is shown in FIG. 3B.

The switching network 62 includes a third pair 90 of switches 92, 94. Switch 92 has an output connected to the (−) input terminal 20 of comparator 22 and switch 94 has an output connected to the (+) terminal 18 of comparator 22, as shown. Inputs of the switches 92, 94 are coupled to the fixed reference potential, $V_0$, here 2.5 volts. The controller 80 couples the train of binary signals on line 82 (FIG. 3A) to the third pair of switches 92, 94. The third pair of switches 92, 94 are therefore placed in the same logic state (i.e., open/closed) as the switches 34, 40, 50 and 56. Capacitors $C_4$ and $C_5$, here both equal to $C_1$, are connected between the fixed reference, $V_0$, and input terminals 18 and 20, respectively, as shown, to prevent the voltages at terminals 18, 20 from swinging too far away from $V_0$. The capacitors $C_4$ and $C_5$ are equal to each other. It should be noted that these capacitors will affect the magnitude of the voltage $V_{20}-V_{18}$ in equation (5) below used to detect an invalid reference voltage but will not affect the polarity of the voltage $V_{20}-V_{18}$ in equation (5) and therefore are not considered in the foregoing analysis for simplicity.

During the first operating phase, $\phi_1$, switches 34, 40, 50, 56, 92 and 94 are closed, while switches 36, 42, 52 and 58 are open. Thus, during the first phase, $\phi_1$, the switching network 16 couples the reference voltage input terminals REFIN (+), REFIN (−) and the local reference voltage source 14 (i.e. terminals BG(−), BG(+)) to the (−), (+) input terminals 20, 18 of comparator 22, respectively, as shown. Further, because, during this first phase, $\phi_1$, switches 92, 94 are closed, the fixed reference voltage, $V_0$, is established at the (+), (−) input terminals 18, 20. Thus, the switching network 16 is adapted to store a charge on capacitors $C_2$, $C_0$ related to voltages on the pair of local reference voltage source input terminals BG(+), BG(−), respectively. That is, the charge stored on capacitor $C_2$ during phase, $\phi_1$, will be: $Q_{C2}|_{\phi1}=[C_2][V_{BG(+)}-V_0]$, and the charge stored on capacitor $C_0$ during phase, $\phi_1$ will be: $Q_{C0}|_{\phi1}=[C_0][V_{BG(-)}-V_0]$.

During the succeeding phase, $\phi_2$, the switching network 16 couples the reference voltage input terminal 10 REFIN (+) and the local reference voltage source 14 terminal BG(−) to the (+) input terminals 18, and couples terminals REFIN (−) and BG(+) to the (−) input terminal 20 of the comparator 22. Thus, while during the first phase, $\phi_1$, terminals REFIN (+) and BG(−) were coupled, through capacitors $C_1$, $C_0$, respectively, to (−) input terminal 20 and terminals REFIN (−) and BG(+) were coupled, through capacitors $C_3$, $C_2$, respectively, to (+) input terminal 18; during the second phase, $\phi_2$, terminals REFIN(+) and BG(−) are coupled, through capacitors $C_3$, $C_2$, respectively, to (+) input terminal 18 and terminals REFIN(−) and BG(+) are coupled, through capacitors $C_1$, $C_0$, respectively, to (−) input terminal 20. Thus, the charge stored on capacitor $C_2$ during phase, $\phi_2$, will be: $Q_{C2}|_{\phi2}=[C_2][V_{BG(-)}-V_{18}]$, and the charge stored on capacitor $C_0$ during phase, $\phi_2$, will be: $Q_{C0}|_{\phi2}=[C_0][V_{BG(+)}-V_{20}]$; where $V_{18}$ is the voltage at input terminal 18 and $V_{20}$ is the voltage at input terminal 20.

Considering first the case where the reference voltage input terminals REFIN(+) and REFIN (−) are connected to a valid external reference supply 12. With a valid reference voltage source 12 connected to terminals REFIN(+), REFIN (−), during phase, $\phi_1$, the charge on capacitor $C_1$ will be:

$$Q_{C1}|_{\phi1}=[C_1][V_0-V_{REF(+)}];$$

and the charge on capacitor $C_3$ will be:

$$Q_{C3}|_{\phi1}=[C_3][V_0-V_{REF(-)}];$$

where $V_{REF(+)}$ is the voltage at the positive terminal of the external reference source 12 and $V_{REF(-)}$ is the voltage at the negative terminal of the external reference source 12. Further, as noted above, during phase, $\phi_1$ the charge stored on capacitor $C_2$ during phase, $\phi_1$, will be:

$$Q_{C2}|_{\phi1}=[C_2][V_{BG(+)-V0}],$$

and the charge stored on capacitor $C_0$ during phase, $\phi_1$, will be:

$$Q_{C0}|_{\phi1}=[C_0][V_{BG(-)}-V_0].$$

As noted above, during phase, $\phi_2$ the charge stored on capacitor $C_2$ will be:

$$Q_{C2}|_{\phi2}=[C_2][V_{BG(-)}-V_{18}],$$

and the charge stored on capacitor $C_0$ during phase, $\phi_2$, will be:

$$Q_{C0}|_{\phi2}=[C_0][V_{BG(+)}-V_{20}].$$

With a valid external reference voltage source 12 connected to terminals REFIN(+), REFIN(−), during phase $\phi_2$, the charge on capacitor $C_1$ will be:

$$Q_{C1}|_{\phi2}=[C_1][V_{20}-V_{REF(-)}];$$

and the charge on capacitor $C_3$ will be:

$$Q_{C3}|_{\phi2}=[C_3][V_{18}-V_{REF(+)}]$$

Thus, because the input to the comparator 22 is a high impedance, the change in charge across capacitor $C_1$ will equal the change in charge across $C_0$. Likewise, the change in charge across capacitor $C_2$ will equal the change in charge across $C_3$. Therefore, $$C_1[V_0 - V_{REF(+)}] - C_1[V_{20} - V_{REF(-)}] = C_0[V_{BG(-)} - V_0] + C_0[V_{BG(+)} - V_{20}] \quad (1)$$

so that:
In like manner:

$$V_{20} = V_0 - \frac{C_1}{C_0 + C_1}[V_{REF(+)} - V_{REF(-)}] + \frac{C_0}{C_1 + C_0}[V_{BG(+)} - V_{BG(-)}] \quad (2)$$

$$C_3[V_O - V_{REF(-)}] - C_3[V_{18} - V_{REF(+)}] = C_2[V_{BG(+)} - V_O] - C_2[V_{BG(-)} - V_{18}] \quad (3)$$

so that:

$$V_{18} = V_0 + \frac{C_3}{C_3 + C_2}[V_{VREF(+)} - V_{REF(-)}] - \frac{C_2}{C_3 + C_2}[V_{BG(+)} - V_{BG(-)}] \quad (4)$$

Thus, with $C_1 = C_3$; $C_2 = C_0$ and now considering the effect of capacitors $C_4$ and $C_5$, with $C_4 = C_5$:

$$V_{20} - V_{18} = \frac{2C_1}{[C_1 + C_0 + C_5]}\left[-(V_{REF(+)} - V_{REF(-)}) + \frac{C_0}{C_1}(V_{BG(+)} - V_{BG(-)})\right] \quad (5)$$

Therefore, when reference voltage $[V_{REF(+)} - V_{REF(-)}]$ is greater than a predetermined minimum voltage level $[C_0/C_1][V_{BG(+)} - V_{BG(-)}]$, (i.e. a valid condition at reference voltage input terminals REFIN(+), REFIN(−)), the comparator input terminal 18 will be greater than, i.e., more positive than, the voltage at comparator terminal 20. When reference voltage $[V_{REF(+)} - V_{REF(-)}]$ is less than the predetermined minimum voltage level $[C_0/C_1][V_{BG(+)} - V_{BG(-)}]$, (i.e. an invalid condition at at least one of the reference voltage input terminals REFIN(+), REFIN(−)), the comparator input terminal 18 will be less than, i.e., more negative than, the voltage at comparator terminal 20. Here, $C_1 = 2.5C_0$, $V_{BG(+)} = 1.25$ volts and $V_{BG(+)} = 0$ volts. Thus, the predetermined minimum voltage level is here 0.5 volts.

Considering next the case where the reference input terminal REFIN(+) is open circuit. During phase $\phi_1$, the voltage on plate 46 of capacitor $C_3$ will charge to $V_{REF(-)}$ while the REFIN(+) terminal will be at an arbitrary voltage because it is open circuit. During the second phase $\phi_2$, plate 46 will be coupled to the REFIN(+) terminal and the voltage on the terminal REFIN(+) will be charged from the arbitrary voltage towards $V_{REF(-)}$. After a sufficient number of cycles, the voltage difference between REFIN(+) and REFIN(−) will drop below the above mentioned predetermined minimum voltage level, here 0.5 volts. The capacitor $C_1$ contributes, in like manner, to this charging process. In response to the ENABLE signal, the logic signal on line 17 will indicate an invalid reference. Considering now the case where the reference voltage input terminal REFIN(−) is open circuit. During phase $\phi_1$, the voltage on plate 44 of capacitor $C_1$ will charge to $V_{REF}(+)$ while the REFIN(−) terminal will be at an arbitrary voltage because it is open circuit. During the second phase $\phi_2$, plate 44 will be coupled to the REFIN(−) terminal and the voltage on the terminal REFIN(−) will be charged from the arbitrary voltage towards $V_{REF}(+)$. After a sufficient number of cycles, the voltage difference between REFIN(+) and REFIN(−) will drop below the above mentioned predetermined minimum voltage level, here 0.5 volts. The capacitor $C_3$ contributes, in like manner, to this charging process. In response to the ENABLE signal, the logic signal on line 17 will indicate an invalid reference.

Considering now the case where the reference voltage input terminals REFIN(+) and REFIN (−) are both open. In such case, during phase $\phi_1$, the voltage on plate 44 of capacitor $C_1$ will charge to an arbitrary voltage on REFIN(+) and the voltage on plate 46 of capacitor $C_3$ will charge to an arbitrary voltage on REFIN(−) because terminals REFIN(−) and REFIN(+) are open circuit. During the second phase $\phi_2$, plate 44 will be coupled to the REFIN(−) terminal and plate 46 will be coupled to the REFIN(+) terminal. Thus, the voltages on the terminals REFIN(+) and REFIN(−) will be charged from their respective arbitrary voltages towards an intermediate arbitrary voltage. Because the voltages on terminals REFIN(+) and REFIN(−) move towards this same intermediate arbitrary voltage, after a sufficient number of cycles, the voltage difference between REFIN(+) and REFIN(−) will drop below the above mentioned predetermined minimum voltage level, here 0.5 volts. In response to the ENABLE signal, the logic signal on line 17 will indicate an invalid reference.

Considering now the case where the reference voltage input terminals REFIN(+) and REFIN (−) are short circuited, or less than the predetermined minimum voltage level, here 0.5 volts. In such case, voltages on the input terminals REFIN(+) and REFIN (−) will be substantially equal (i.e., equal to within the predetermined minimum level, here 0.5 volts). In response to the enable signal on line ENABLE, the comparator 22 produces a logic signal, here logic 0 on line 17 indicating that an invalid external reference has been connected to the circuit 10. Further, referring to equation (5) above, the voltage $V_{18}$ at terminal 18 will be more negative than the voltage $V_{20}$ terminal 20.

It should be noted that, in some applications, when the voltage across the reference input terminals REFIN(+), REFIN(−) is greater than a predetermined maximum voltage level, such condition may be considered, for that application, as an invalid condition. That is, what is considered as a valid condition in this application may be considered as an invalid condition in another application. In general, then, circuit 10 provides an indication of one of two conditions at the reference input terminals REFIN(+), REFIN(−) depending on whether the voltage across such reference input terminals is above, or below, a predetermined reference voltage, here 0.5 volts. Thus, when the voltage across the reference input terminals REFIN(+), REFIN(−) is greater than a predetermined maximum voltage level, here 0.5 volts, the comparator 22 indicates on line 17 one of the two conditions, here a valid condition.

Figure 4:
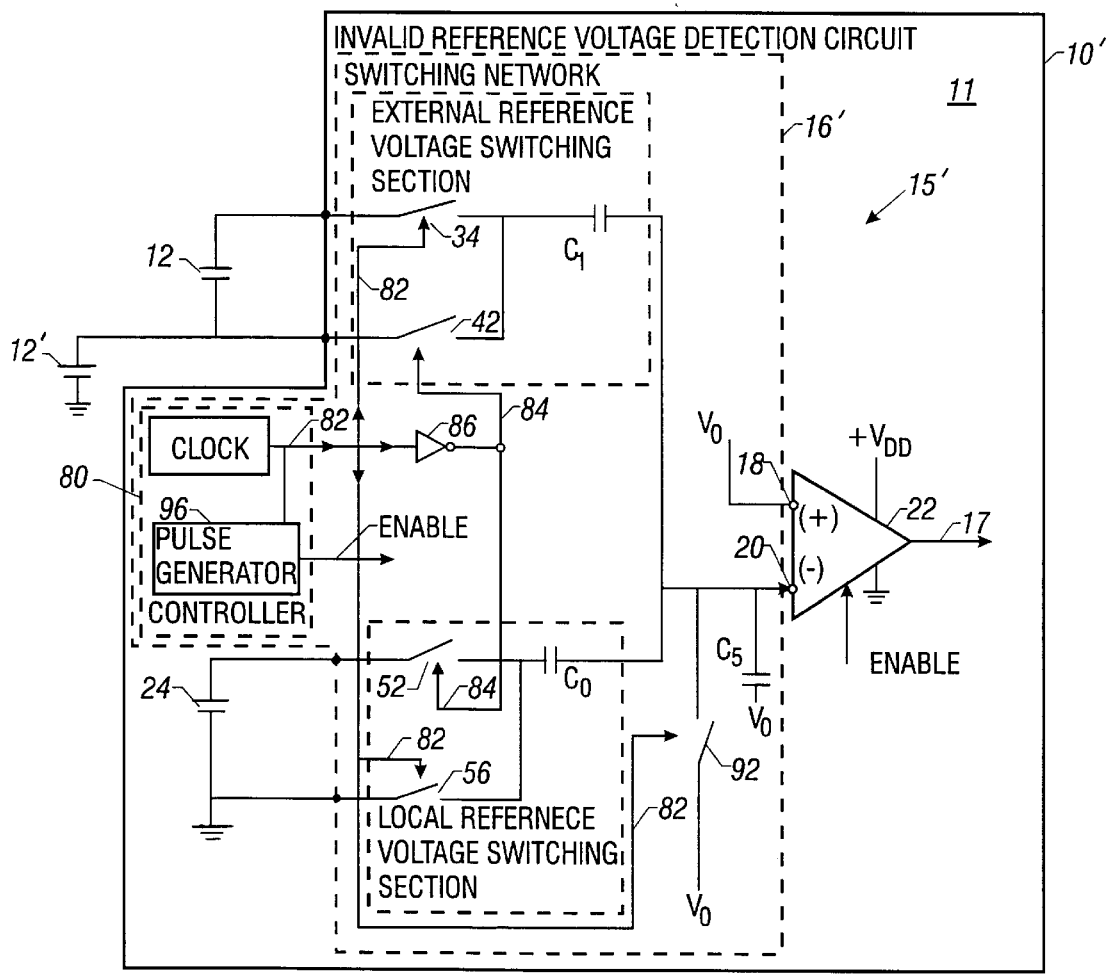
FIG. 4 is a schematic diagram of an invalid reference voltage detection circuit according to the invention.

Referring now to FIG. 4, an invalid reference voltage detection circuit 10' is shown. Thus, circuit 10' again includes a comparison circuit 15' which includes a switching network 16' and comparator 22. Here, capacitors $C_2$ and $C_3$ of switching network 16 (FIG. 2) have been removed along with switches 36, 40, 50, 58 and 94. Thus, terminal 18 is connected to the reference potential $V_o$ during both phase $\phi_1$ and $\phi_2$. During the first phase $\phi_1$, controller 80 closes switches 34, 56 and 92 while opening switches 42 and 52.

During the subsequent second phase $\phi_2$, controller 80 opens switches 34, 56 and 92 while closing switches 42 and 52. At the end of the second phase, the pulse generator 96 produces the ENABLE signal for the comparator 22. Thus, from the above discussion:

$$V_{20} - V_0 = \qquad (6)$$

$$\frac{C_1}{[C_1 + C_0]} \left[ -(V_{REF(+)} - V_{REF(-)}) + \frac{C_0}{C_1}(V_{BG(+)} - V_{BG(-)}) \right]$$

Therefore, when reference voltage $[V_{REF(+)}-V_{REF(-)}]$ is greater than a predetermined minimum voltage level $[C_0/C_1][V_{BG(+)}-V_{BG(-)}]$, (i.e., a valid condition exists at reference input terminals REFIN(+), REFIN(−)), the comparator input terminal 18 will be greater than, i.e., more positive than, the voltage at comparator terminal 20. When reference voltage $[V_{REF(+)}-V_{REF(-)}]$ is less than the predetermined minimum voltage level $[C_0/C_1][V_{BG(+)}-V_{BG(-)}]$, (i.e., an invalid condition exists at at least one of the reference input terminals REFIN(+), REFIN(−)), the comparator input terminal 18 will be less than, i.e., more negative than, the voltage at comparator terminal 20. Here, $C_1=2.5C_0$, $V_{BG(+)}=1.25$ volts and $V_{BG(-)}=0$ volts. Thus, the predetermined minimum voltage level is here 0.5 volts.

Figure 5:
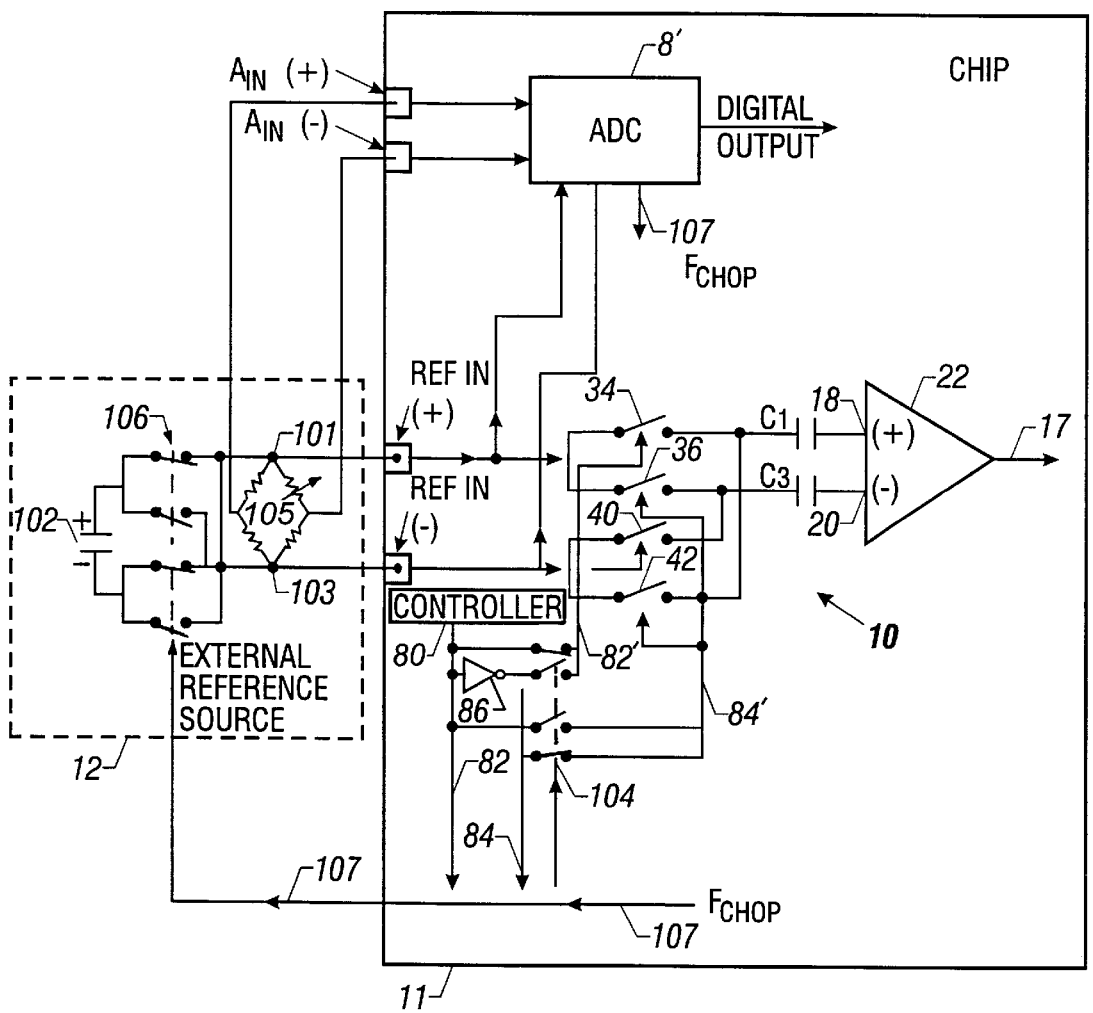
FIGS. 5 and 6 are schematic diagrams showing applications of the invalid reference voltage detection circuit of FIG. 2.

Referring now to FIG. 5, an application of the invalid reference voltage detection circuit 10 (FIG. 2) is shown. Here, the analog/digital conversion system 7 (FIG. 1) is an analog to digital converter (ADC) 8' adapted to convert an analog signal fed to terminals $A_{IN}(+)$, $A_{IN}(-)$ into a corresponding digital signal on the DIGITAL OUTPUT line. One such ADC is described in copending patent application entitled "Analog to Digital Conversion System", inventor, Damien McCartney, filed concurrently herewith, assigned to the same assignee as the present invention, the contents thereof being incorporated herein by reference. Here, the analog signal to be converted into a corresponding digital signal is produced at the outputs of a bridge 105. A voltage supply 102 is fed to the inputs 101, 103 of the bridge 105 by a switching network 106, as shown. Here, the switching network 106, in response to chop signals, $f_{CHOP}$, on line 107 supplied by the ADC 8' in a manner described in the above referenced patent application, feeds a positive potential of supply 102 to input 101 and to the REFIN(+) terminal during the first half of a chop period (i.e., when the chop signal on line 107 is "low") and the negative potential of supply 102 to input 103 and to the REFIN(−) terminal during the first half of the chop period. During the second half of the chop period (i.e., when the chop signal on line 107 is "high") the switching network 106 feeds a positive potential of supply 102 to input 103 and to the REFIN(−) terminal and the negative potential of supply 102 to input 101 and to the REFIN(+) during the first half.

Here only a portion of the invalid reference detection circuit 10 of FIG. 2 is shown in FIG. 5. In order to take into account that the polarity of the voltage from the external voltage source 12 is switching at the chop frequency, $f_{CHOP}$, a switching network 104 is included, as shown. The switching network 104 is controlled by the chop signals on line 107. The pulses produced by controller 80 are again fed directly to line 82 and to line 84 through inverter 86, as described above in connection with FIG. 2. (It should be understood that the connections to switches 50, 52, 56, 58, 92, 94, not shown, are unchanged from FIG. 2). Here, however, during the first half of the chop period, the pulses produced by controller 80 are fed directly to line 82' and to line 84' through inverter 86. The pulses on line 82' control switches 34 and 40, as described above in connection with FIG. 2. Likewise, the pulses on line 84' control switches 36 and 42, as described above in connection with FIG. 2. However, during the second half of the chop period, the pulses produced by controller 80 are fed directly to line 84' and to line 82' through inverter 86. Thus, the comparator 22 produces on line 17 an indication of the invalid/valid condition at the reference input terminals REFIN(+), REFIN(−), as described above in connection with FIG. 4.

With external reference chopping being performed, when the chop signal is high the voltage at the REFIN(+) terminal will actually be less than the voltage at the REFIN(−) terminal; however this is not an invalid condition. The purpose of switching section 104 is to correct for the inversion by performing the same comparison previously performed as when reference was not inverted (i.e., chop=0), but when the reference is inverted (i.e., chop=1) the comparison being performed is whether [REFIN(−)−REFIN(+)] is above a certain threshold, here 0.5 volts.

Figure 6:
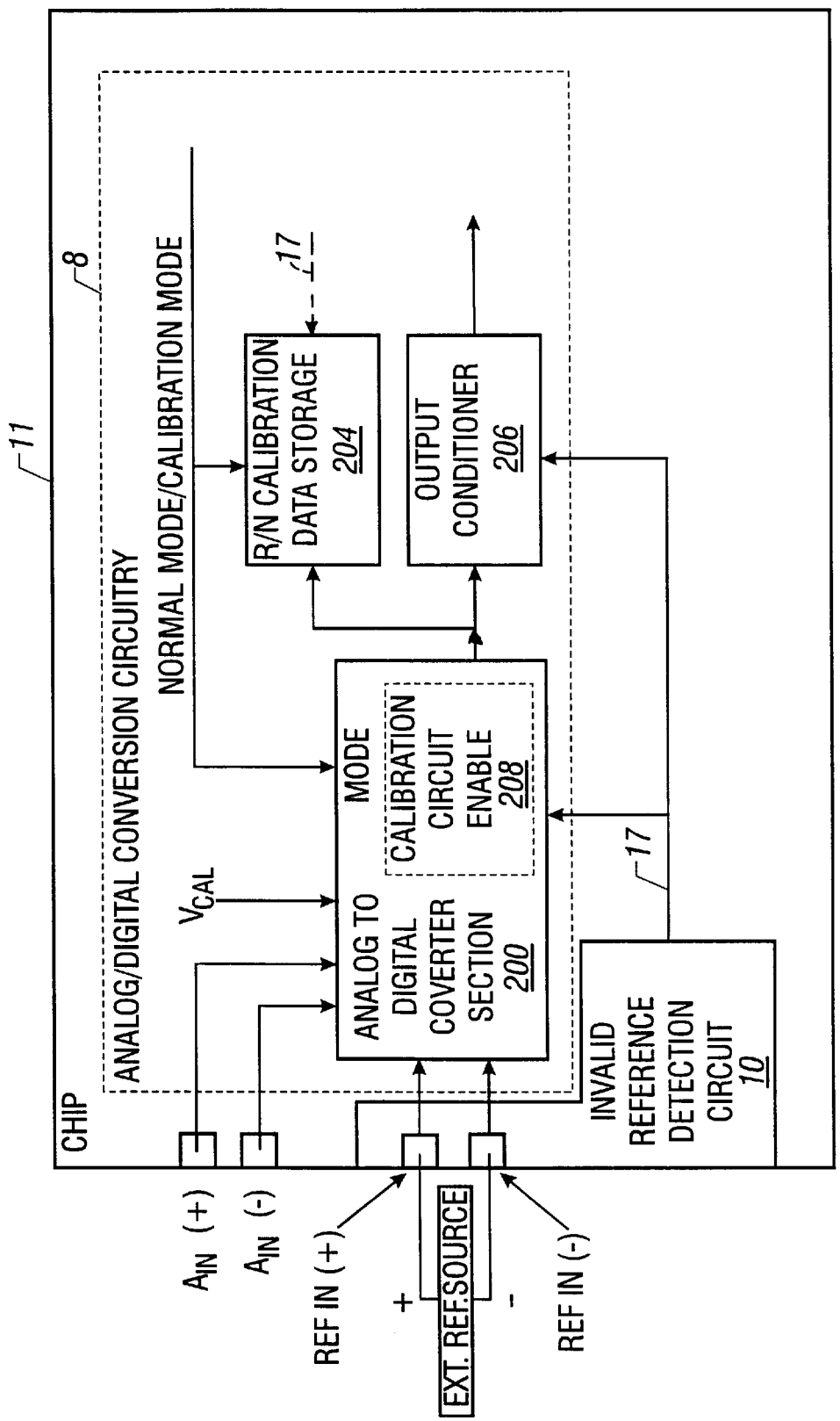

Referring now to FIG. 6, another application of the invalid reference detection circuit 10 is shown. Here again, as in FIG. 1, the analog/digital conversion circuitry 8 and the invalid reference detection circuit 10 are formed on a semiconductor chip 11 and an external reference source 12 is connected to the reference input terminals REFIN(+), REFIN(−), as shown. Here, the analog/digital conversion circuitry 8 includes an analog to digital converter (ADC) section 200, a calibration data storage 204 and an output conditioner 206. The ADC section 200 is fed by: a calibration voltage, $V_{CAL}$; the analog signal being converted and applied to the input terminals $A_{IN+}$, $A_{IN(-)}$; and a normal mode/calibration mode signal fed to the MODE terminal of the ADC section 10, as shown. During a calibration mode the calibration voltage, $V_{CAL}$ is used by ADC section 200 and during a normal mode the analog signal to be converted is fed to the input terminals $A_{IN(+)}$, $A_{IN(-)}$ of the ADC section 200 as described in copending application entitled "Gain Calibration Circuitry for an Analog to Digital Converter", inventors Damien McCartney and John O'Dowd, assigned to the same assignee as the present invention and filed concurrently herewith, the contents thereof being incorporated herein by reference. As described therein, during the calibration mode, the calibration voltage, $V_{CAL}$ is fed to calibration circuitry 208 in the ADC section 200 (i.e., a delta sigma modulator and output filter).

Here, when the invalid reference detection circuit 10 produces on line 17 an indication that a valid reference voltage is present at the terminals REFIN(+), REFIN(−), during the calibration mode the calibration circuit 208 is enabled and the calibration voltage $V_{CAL}$ is used by the calibration circuit 208 in the ADC section 200 to produce calibration data for storage in the write (W) enabled calibration data storage 204 for use by the analog/digital conversion system during the normal mode. More particularly, during the normal mode the digital words produced by the ADC section 200 are modified in output conditioner 206 by the previously stored calibration data now read (R) from calibration data storage 204. However, when the invalid reference detection circuit 10 produces on line 17 an indication that an invalid reference voltage is present at at least one of the terminals REFIN(+), REFIN(−), during the calibration mode, the calibration circuit is disabled.

Alternatively, the invalid signal on line 17 may be fed to the calibration storage 204 as shown by the dotted line 17 feeding the storage 204. In such case, while the calibration data may be produced by the calibration circuit 208, such calibration data will not be stored in the calibration data storage 204 when circuit 10 indicates an invalid condition at at least one of the terminals REFIN(+), REFIN(−).

During a normal mode, in response to an invalid condition on line 17, a predetermined value may be produced at the output of output conditioner 206 (i.e., at the output of the conversion circuitry 8), or the analog input may be clamped to a predetermined level. In either case, the digital word produced by the conversion circuitry 8 will be a predetermined value when the comparison circuit output signal indicates detection of an invalid condition at the at least one of the reference input terminals.

Other embodiments are within the spirit and scope of the appended claims. For example, while the invalid reference detection circuit has been described above for use in an analog to digital converter such circuit may also be used in other analog/digital conversion circuitry such an a digital to analog converter. Further, it should be understood, as noted above, that REFIN(-) may be the ground connection to the chip and therefore such ground connection in effect provides the terminal REFIN(-).

What is claimed is:

1. An analog to digital conversion system, comprising:
    (a) analog to digital conversion circuitry formed on a semiconductor chip for producing digital words in response to an analog signal;
    (b) an invalid reference detection circuit, comprising:
        reference input terminals formed on the chip, such terminals being adapted for coupling to a reference source external to the chip, such reference terminals being coupled to the conversion circuitry to provide a reference for such conversion circuitry;
        a local reference source formed on the chip;
        a comparison circuit, formed on the chip, responsive to the local reference source and a condition at the reference input terminals, to detect an invalid condition at at least one of the reference input terminals and to produce an output signal indicative of the detected invalid condition; and
    wherein the conversion circuitry includes circuitry for causing one of the produced digital words to be a predetermined value when the comparison circuit output signal indicates detection of an invalid condition at the least one of the reference input terminals.

2. An analog to digital conversion system, comprising:
    (a) analog to digital conversion circuitry formed on a semiconductor chip for producing digital words in response to an analog signal;
    (b) an invalid reference detection circuit, comprising:
        reference input terminals formed on the chip, such terminals being adapted for coupling to a reference source external to the chip, such reference terminals being coupled to the conversion circuitry to provide a reference for such conversion circuitry;
        a local reference source formed on the chip;
        a comparison circuit, formed on the chip, responsive to the local reference source and a condition at the reference input terminals, to detect an invalid condition at at least one of the reference input terminals and to produce an output signal indicative of the detected invalid condition; and
    wherein the conversion system includes calibration circuitry for storing calibration data during a calibration mode, such calibration data being used by the conversion circuitry during a normal operating mode, and wherein calibration data is not stored when the comparison circuit output signal indicates detection of an invalid condition at the at least one of the reference input terminals.

3. The conversion system recited in claim 2 wherein calibration data is inhibited from storage during the calibration mode when the comparison circuit output signal indicates detection of an invalid condition at the at least one of the reference input terminals.

4. The conversion system recited in claim 2 wherein calibration mode is inhibited when the comparison circuit output signal indicates detection of an invalid condition at at least one of the reference input terminals.

5. The invalid reference detection circuit recited in claims 1, 2, 3 or 4 wherein the invalid condition at the at least one of the reference input terminals is an open circuit condition in at least one of the reference input terminals.

6. The invalid reference detection circuit recited in claims 1, 2, 3, or 4 wherein the invalid condition at the at least one of the reference input terminals is a condition wherein the voltage across the reference input terminals is below a predetermined minimum voltage level.

7. The invalid reference detection circuit recited in claims 1, 2, 3, or 4 wherein the invalid condition at the at least one of the reference input terminals is a short circuit condition between the terminals.

8. The invalid reference detection circuit recited in claims 1, 2, 3 and 4 wherein the invalid condition at the at least one of the reference input terminals is a condition wherein the voltage across the reference input terminals is above a predetermined maximum voltage level.

9. A method for detecting an open circuit condition on at least one of a pair of reference input terminals, comprising:
    periodically transferring charge between the pair of reference input terminals by a switched capacitor so that the voltage difference between the terminals decreases below a predetermined level in the presence of the open circuit condition;
    detecting whether the voltage difference between the terminals is below the predetermined level;
    producing an output signal indicative of such detection.

10. A circuit, comprising:
    a local reference voltage source formed on a semiconductor chip;
    an external reference voltage switch section, formed on the chip, having:
        external reference voltage input terminals adapted for coupling to an reference voltage source disposed external to the chip and,
        a first capacitor;
    a local reference voltage switching section, formed on the chip, coupled to the local reference voltage source and having:
    a second capacitor;
    a comparator, formed on the chip; and, wherein:
    the first capacitor has a first plate connected to the external reference voltage switching section and a second plate connected to an input terminal of the comparator; and
    the second capacitor has a first plate connected to the local reference voltage switching circuit and a second plate connected to the input terminal of the comparator.

11. The circuit recited in claim 10 wherein the switching sections include a plurality of switches and including a controller for producing control signals for the plurality of switches to operate the circuit in sequential phases, during one phase, coupling a first one of the pair of external reference voltage input terminals and a first polarity of a local reference voltage source to the input of the comparator through the first and second capacitors, respectively, and establishing at the second plates of the capacitors a fixed reference potential, and, during a succeeding phase, coupling the second one of the pair of external reference voltage input terminals and a second polarity of the local reference voltage source through the first and second capacitors, respectively, to the input of the comparator and removing the fixed reference potential from the second plates of the capacitors; and wherein the comparator produces at the termination of the second phase an output indicative of whether the reference voltage is valid or invalid in response to the voltage produced at the input to the comparator.

12. The circuit recited in claim 11 wherein the external reference switching section includes a third capacitor and wherein the local reference switching section includes a fourth capacitor, and wherein the controller produces control signals to operate the plurality of switches enabling, during the first phase, the switching sections to also couple the second one of a pair of external reference voltage input terminals and the second polarity of the local reference voltage source to a second input of the comparator through the third and fourth capacitors, respectively, and during the succeeding phase, coupling the first one of the pair of external reference voltage terminals and the first polarity of the local reference voltage supply to the second input terminal of the comparator through the third and fourth capacitors, respectively.

* * * * *